(12) United States Patent  (10) Patent No.: US 8,031,018 B2
Kahmen  (45) Date of Patent: Oct. 4, 2011

(54) OSCILLATOR WITH COUPLED AMPLIFIER

(75) Inventor: Gerhard Kahmen, Deisenhofen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 108 days.

(21) Appl. No.: 12/159,056

(22) PCT Filed: Feb. 21, 2007

(86) PCT No.: PCT/EP2007/001510
§ 371 (c)(1),
(2), (4) Date: Jun. 24, 2008

(87) PCT Pub. No.: WO2007/101553
PCT Pub. Date: Sep. 13, 2007

(65) Prior Publication Data
US 2008/0297266 A1   Dec. 4, 2008

(30) Foreign Application Priority Data
Mar. 1, 2006   (DE) .......................... 10 2006 009 467

(51) Int. Cl.
*H03B 5/18*   (2006.01)
*H03C 3/22*   (2006.01)
(52) U.S. Cl. ................. 331/117 R; 331/177 V; 331/179
(58) Field of Classification Search ................ 331/36 C, 331/117 D, 117 FE, 117 R, 177 V, 179
See application file for complete search history.

(56) References Cited

U.S. PATENT DOCUMENTS

| | | | | |
|---|---|---|---|---|
| 4,056,787 A | * | 11/1977 | Saitoh et al. ..................... 331/59 |
| 4,638,264 A | | 1/1987 | Ueno | |
| 4,998,077 A | * | 3/1991 | Nanni et al. ..................... 331/99 |
| 5,055,889 A | | 10/1991 | Beall | |
| 5,373,264 A | * | 12/1994 | Higgins, Jr. ................ 331/117 R |
| 5,668,506 A | * | 9/1997 | Watanabe et al. ................ 331/66 |
| 5,892,410 A | * | 4/1999 | Peckham ................... 331/117 R |
| 6,466,099 B2 | * | 10/2002 | Festag ......................... 331/117 R |
| 2005/0270114 A1 | | 12/2005 | Hino | |

FOREIGN PATENT DOCUMENTS

| | | |
|---|---|---|
| DE | 3301 492 C2 | 8/1983 |
| DE | 4 327 138 A1 | 7/1994 |
| EP | 1 223 667 A2 | 7/2002 |
| EP | 1 223 667 A3 | 7/2002 |
| GB | 2 223 903 A | 4/1990 |
| GB | 2 274 562 A | 7/1994 |
| GB | 2274562 A | 7/1994 |

OTHER PUBLICATIONS

International Preliminary Report on Patentability, PCT/EP2007/001510, Oct. 16, 2008, pp. 1-9.

Bentley N. Scott et al; "Monolithic Voltage Controlled Osciallator for X and Ku-Bands"; Texas Instruments Incorporated Central Research Laboratories, Dallas Texas; 1982 IEEE MTT-S Digest pp. 482-485.

* cited by examiner

*Primary Examiner* — Levi Gannon
(74) *Attorney, Agent, or Firm* — Ditthavong Mori & Steiner, P.C.

(57) ABSTRACT

An oscillator including a resonator with at least one first tuneable element, with which a resonant frequency of the resonator can be varied. The oscillator further includes an amplifier, which provides an amplification element, connected to the resonator at a coupling position. The amplifier provides a second tuneable element, by which a complex resistance, which the amplifier provides at the coupling position, is variable in a frequency-dependent manner.

13 Claims, 8 Drawing Sheets

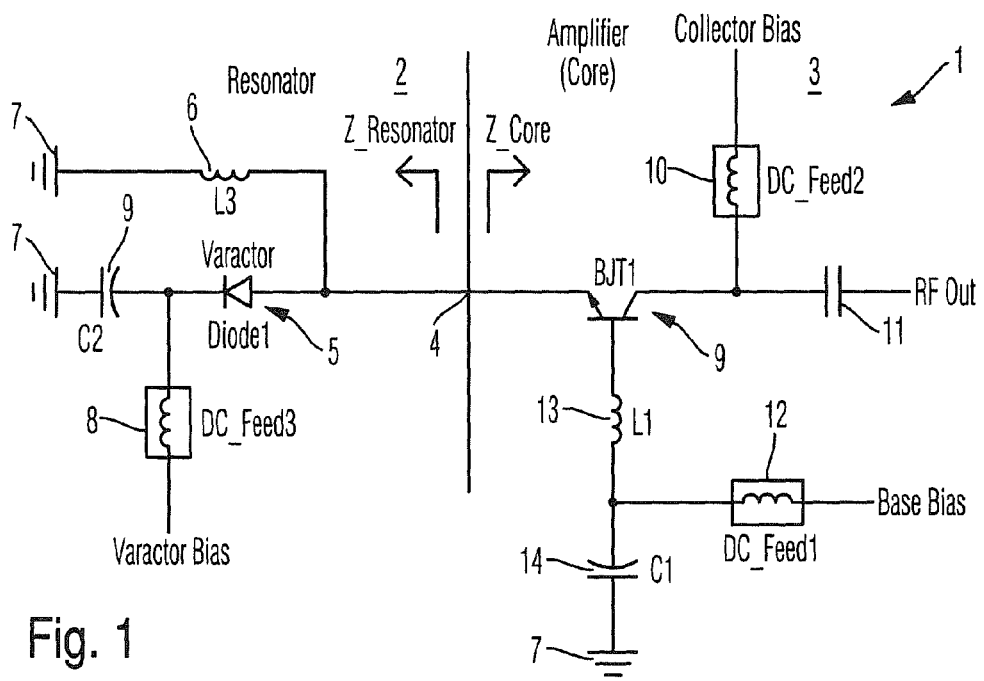
Fig. 1
(Prior art)
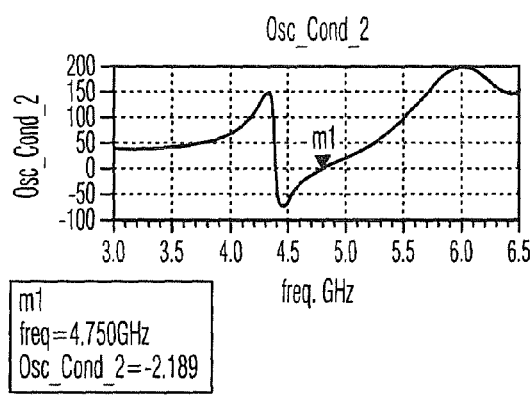
Fig. 2A
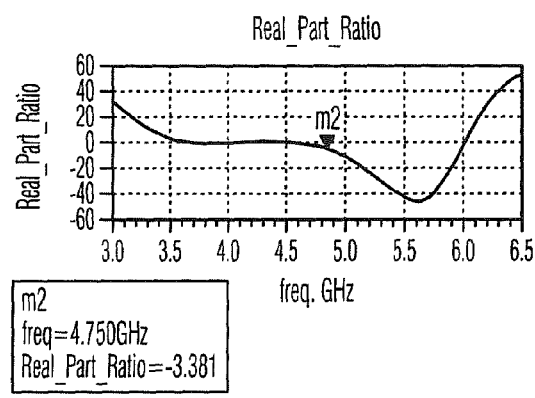
(Prior art)    Fig. 2B
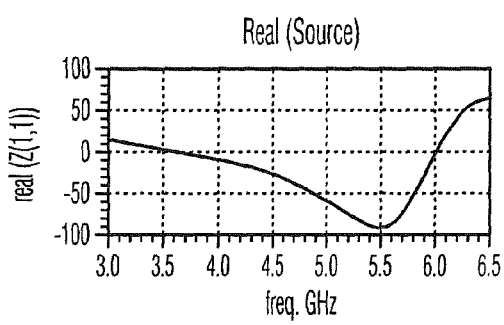
Fig. 3A
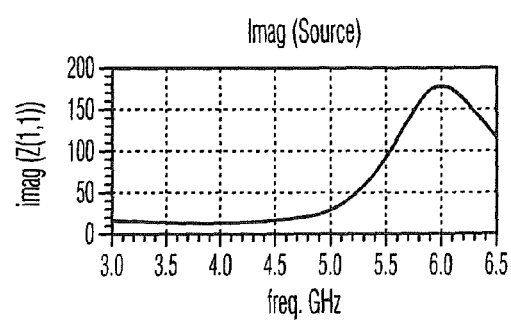
(Prior art)    Fig. 3B

US 8,031,018 B2

OSCILLATOR WITH COUPLED AMPLIFIER

CROSS-REFERENCE TO RELATED APPLICATION

The present application is a national stage filing of PCT Application No. PCT/EP2007/001510, filed on Feb. 21, 2007, and claims priority to German Application No. 10 2006 009 467.0, filed on Mar. 1, 2006, the entire contents of which are herein incorporated by reference.

BACKGROUND OF THE INVENTION

1. Field of the Invention

The invention relates to an oscillator, especially for microwave circuits.

2. Discussion of the Background

An oscillator is known, for example, from US 2005/0270114 A1.

The phase noise of a voltage-controlled oscillator has a significant influence on the quality of the output signal of the system, in which the oscillator is used. It is therefore important in designing voltage-controlled oscillators to suppress the power of the phase noise relative to the useful signal as far as possible. Amongst other influences, the quality factor of the resonator, the bandwidth of the resonator and an optimum start-up reserve of the oscillator play a significant role with regard to the phase noise.

Tuneable oscillators for the microwave range conventionally provide a resonator, which can be tuned with a varactor diode and an amplifier coupled to the latter, also referred to below as the oscillator core. Bipolar transistors are used as the amplification element in a common-base or common-emitter configuration. Instead of bipolar transistors, field-effect transistors can also be used in a common-gate or common-source configuration.

By way of explanation of the problem, upon which the present invention is based, FIG. 1 shows a hitherto conventional oscillator 1 consisting of a resonator 2 and an amplifier 3, which is also referred to as the "core". The resonator 2 and the amplifier 3 are connected to one another at the coupling position 4. The central component of the resonator 2 is a tuneable element 5, which is conventionally formed by a varactor diode, also referred to as a variable-capacitance diode. Applying an electrical voltage to the varactor diode in the reverse direction changes the length of the space-charge zone, and therefore also the capacitance of the varactor diode. For this purpose, the anode of the varactor diode is connected, in the exemplary embodiment via an inductance 6, to the circuit ground 7, and the cathode of the varactor diode 5 is connected via a choke 8 to a tuning voltage, which is positive relative to the ground 7, and which is described in FIG. 1 as the "varactor bias".

As an alternative, it is, of course, also possible to attach the cathode of the varactor diode 5 to the circuit ground and to apply a voltage, which is negative relative to the ground, to the anode. The cathode of the varactor diode 5 is connected via a series capacitor 9 to the circuit ground 7. The capacitance of the varactor diode 5 and the capacitance C2 of the capacitor 9, together with that of the inductance 6 with the inductance value L3, form a resonant oscillating circuit.

The amplifier 3 comprises an amplification element 9. In the exemplary embodiment presented, the amplification element 9 is a bipolar transistor, which is operated in common-base configuration, that is to say, with the base connected to the circuit ground. As an alternative, a common-emitter configuration can also be considered within the framework of the present application. A field-effect transistor, preferably in common-gate configuration, can be used instead of a bipolar transistor. In this context, a common-source configuration can also be considered instead of the common gate-configuration.

In the exemplary embodiment illustrated in FIG. 1, the bipolar transistor 9 is connected by the emitter end to the coupling position 4. The collector of the transistor 9 is connected via a choke 10 to the collector voltage "collector bias". At the same time, the high-frequency output voltage RF Out can be tapped at the collector of the transistor 9 via a capacitor 11. The base voltage "base bias" is supplied to the base via a choke 12 and an inductance 13. The node between the inductance 13 and the choke 12 is connected via a capacitor 14 to the circuit ground 7.

In order to operate the oscillator 1 according to FIG. 1, two conditions must be fulfilled in the steady state of the oscillator 1 as described below.

Initially, in the steady state, the loop amplification of the resonator 2 and the amplifier (core) 3 must be equal to 1, that is to say, the amplifier 3 must compensate the losses of the resonator 2. In other words, the quotient of the real part of the complex resistance of the amplifier viewed from the coupling position 4 and of the real part of the complex resistance of the resonator 2, also viewed from the coupling position 4 must be −1. The complex resistance of the amplifier (core) Z_Core, which is obtained on looking from the coupling position 4 towards the amplifier 3, and the complex resistance Z_Resonator, which is obtained on looking from the coupling position 4 towards the resonator 2, are visualized respectively in FIG. 1. The fact that the real part of the complex resistance Z-Core of the amplifier (core) is negative, results from the amplification (negative resistance). However, for a secure start-up of the oscillator 1, under small signal condition, it must also be ensured that an adequate start-up reserve is available, that is to say, that the quotient is significantly smaller (of a larger value) than −1, ideally approximately −3.

The second condition is a phase condition and leads to the situation that the sum of the imaginary part of the complex resistance of the resonator Z_Resonator and of the amplifier Z_Core at the resonant frequency must be equal to 0. Considered in visual terms, this means that a wave travelling from the coupling position 4 to the resonator 2, where it is reflected, and then travelling to the amplifier 3, where it also reflected with amplification, and finally returning to the coupling position 4, may have changed its phase only by an integer multiple of $2\pi$ (positive feedback), so that the system is resonant for this frequency.

FIG. 2A presents the imaginary part of the sum of the two complex resistances Z_Resonator and Z_Core for a given tuning voltage of the varactor diode 5. It is evident that the second condition Im(Z_Resonator)+Im(Z_Core)=0 at 4.75 GHz is fulfilled. As shown in FIG. 2B, at the same frequency, a ratio of −3.381 is obtained for the quotients of the real parts of the two complex resistances, thereby providing an adequate start-up reserve.

However, the oscillator 1 must be operated over a relatively wide frequency range, wherein the resonant frequency should be variable over several GHz. FIG. 3A presents the real part, and FIG. 3B presents the imaginary part of the complex resistance Z_Core of the amplifier 3. For the example presented, a resonance, which significantly determines and limits the tuning bandwidth is recognizable at approximately 6 GHz. This is evident when adjusting the tuning voltage of the varactor diode 5 of the resonator 2.

FIGS. 4A, 4C and 4E present the imaginary parts of the sum of the imaginary parts of the complex resistances Z_Resonator and Z_Core for different tuning voltages of the varactor diode of 0 V, 12.5 and 25 V. FIGS. 4B, 4D and 4F correspondingly present the quotient of the real parts for the same tuning voltages. It is evident that the second condition for a diminishing imaginary part can be achieved everywhere; however, that the first condition can no longer be achieved everywhere. For example, it is no longer achieved in FIG. 4F for the tuning voltage 25 V; the quotient is even positive. In FIG. 4D, a quotient of only −2.010 is achieved for the tuning voltage 12.5 V; in this context, an adequate start-up reserve should still be available. The invention is therefore a response to the problem that the conditions for operating the oscillator according to the prior art can be achieved only over a relatively-limited frequency range.

SUMMARY OF THE INVENTION

According to an aspect of the invention, an oscillator is provided that can be safely operated over a broader frequency range.

An embodiment of the invention proposes a second tuneable element, for example, a further varactor diode in the amplifier, so that the complex resistance, which the amplifier provides at the coupling position, is variable in a frequency-dependent manner.

The solution according to an aspect of the invention has the advantage of obtaining a further degree of freedom to satisfy the two oscillator conditions by varying the complex resistance of the amplifier. In this context, the first oscillator condition, namely that the quotient of the real part of the complex resistance, which the amplifier provides at the coupling position, relative to the real part of the complex resistance, which the resonator provides at the coupling position, is always less than −1, can be achieved even for higher frequencies. As a result of the fact that the amplifier is tuned as well as the resonator, there are several tuning states, at which the first oscillator condition is fulfilled, and a state, which ensures an adequate overall amplification, can therefore be selected.

In this context, an adequate start-up reserve is generally provided, if the quotient of the real parts of the two complex resistances is less than or equal to −1.9, preferably less than or equal to −3 (in this context, less than means in the mathematical sense of a larger absolute negative number).

A further advantage is in the displacement of the resonance in the imaginary part of the core, which leads to a significantly higher bandwidth.

By particular preference, the tracking of the amplifier is implemented by tracking in the feedback at the base of the bipolar transistor of the amplifier, which is preferably connected in common-base configuration. A varactor diode is preferably used in the feedback branch of the base. In this context, the varactor diode is preferably disposed between the base of the bipolar transistor and the circuit ground. The varactor diode can, however, also be provided in a different position than at the base, for example, in a special phase-shifter network, which is disposed at the emitter end or at the collector end.

If the amplification element is a field-effect transistor, this should preferably be connected in common-gate configuration, and, in this case, the varactor diode is disposed between the gate of the field-effect transistor and the circuit ground.

By preference, a switching device, by means of which a supplementary capacitor connected parallel to the resonator can be connected or respectively disconnected, is provided in parallel to the resonator varactors. As a result, a supplementary capacitor can be connected in parallel to the varactor diode of the first tuneable element in the presence of low-frequencies. Accordingly, the tuning range is subdivided into two sub-bands, and it is no longer necessary to operate the varactor diode within the range of low reverse voltage and therefore high capacitance. Within this range, the varactor diode provides a relatively-high bulk resistance and therefore contributes to a considerable extent to the phase noise of the oscillator. In view of the fact that the varactor diode of the resonator no longer needs to be operated within the high-capacitance range, the phase noise within this frequency range is reduced as a result of an improvement in resonator quality factor.

However, when the resonator is switched into the lower sub-band, the imaginary and real parts of the complex resistance of the resonator are displaced, so that operating points can occur, at which the optimum oscillation conditions are no longer safely fulfilled. This can lead to an interruption of the oscillation. The introduction of a voltage offset between the tuning voltages in the resonator and in the amplifier means that an optimum range for the start-up reserve and therefore also for the phase noise can once again be set for both band ranges.

BRIEF DESCRIPTION OF THE DRAWINGS

Exemplary embodiments of the invention are explained in greater detail below with reference to the drawings. The drawings are as follows:

FIG. 1 shows an oscillator according to the prior art;

FIG. 2A shows the sum of the imaginary parts of the complex resistances of the resonator and of the amplifier according to FIG. 1;

FIG. 2B shows the quotient of the real part of the complex resistance of the amplifier and of the real part of the complex resistance of the resonator according to FIG. 1;

FIG. 3A shows the real part of the complex resistance of the amplifier according to FIG. 1;

FIG. 3B shows the imaginary part of the complex resistance of the amplifier according to FIG. 1;

DETAILED DESCRIPTION OF EXEMPLARY EMBODIMENTS OF THE INVENTION

Figure 4A:
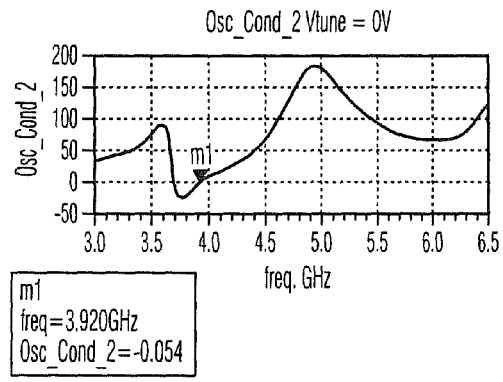
FIG. 4A shows the sum of the imaginary parts of the complex resistances of the resonator and of the amplifier with a tuning voltage of 0 V in the example according to FIG. 1.
Figure 4B:
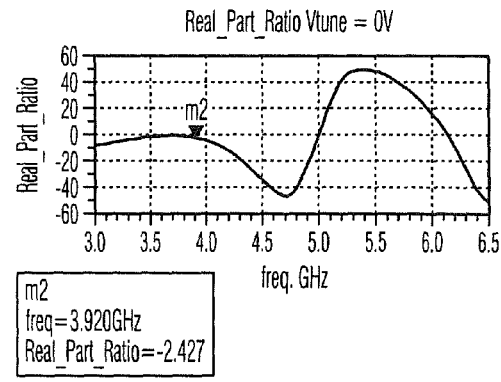
FIG. 4B shows the quotient of the real part of the complex resistance of the amplifier and of the real part of the complex resistance of the resonator with a tuning voltage of 0 V in the example according to FIG. 1.
Figure 4C:
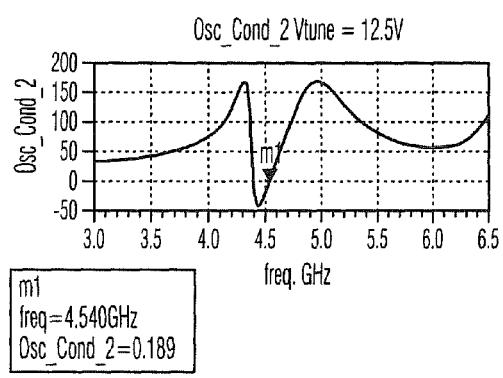
FIG. 4C shows the sum of the imaginary parts of the complex resistances of the resonator and of the amplifier with a tuning voltage of 12.5 V in the example according to FIG. 1.
Figure 4D:
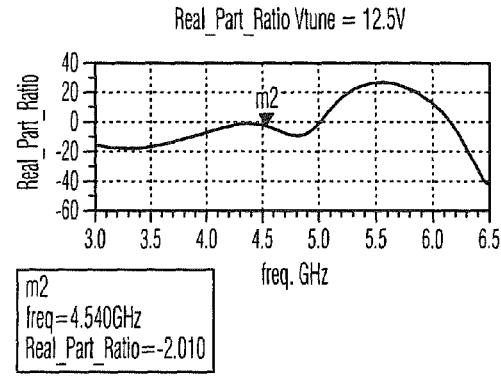
FIG. 4D shows the quotient of the real part of the complex resistance of the amplifier and of the real part of the complex resistance of the resonator with a tuning voltage of 12.5 V in the example according to FIG. 1.
Figure 4E:
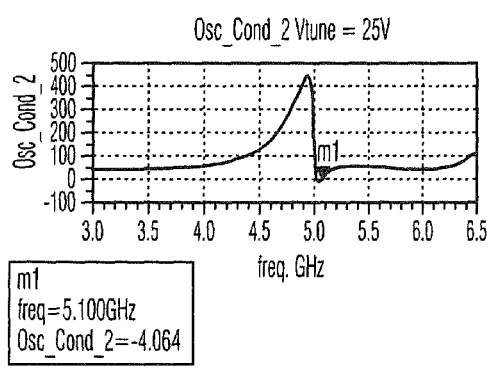
FIG. 4E shows the sum of the imaginary parts of the complex resistances of the resonator and of the amplifier with a tuning voltage of 25 V in the example according to FIG. 1.
Figure 4F:
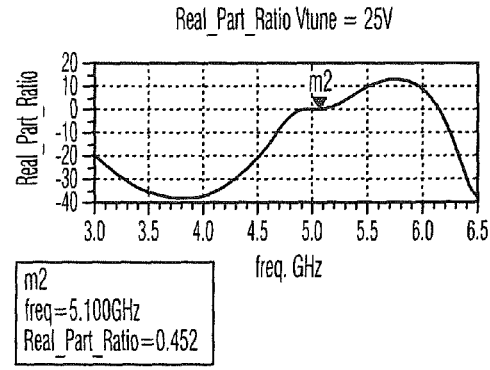
FIG. 4F shows the quotient of the real part of the complex resistance of the amplifier and the real part of the complex resistance of the resonator with a tuning voltage of 25 V in the example according to FIG. 1.
Figure 5:
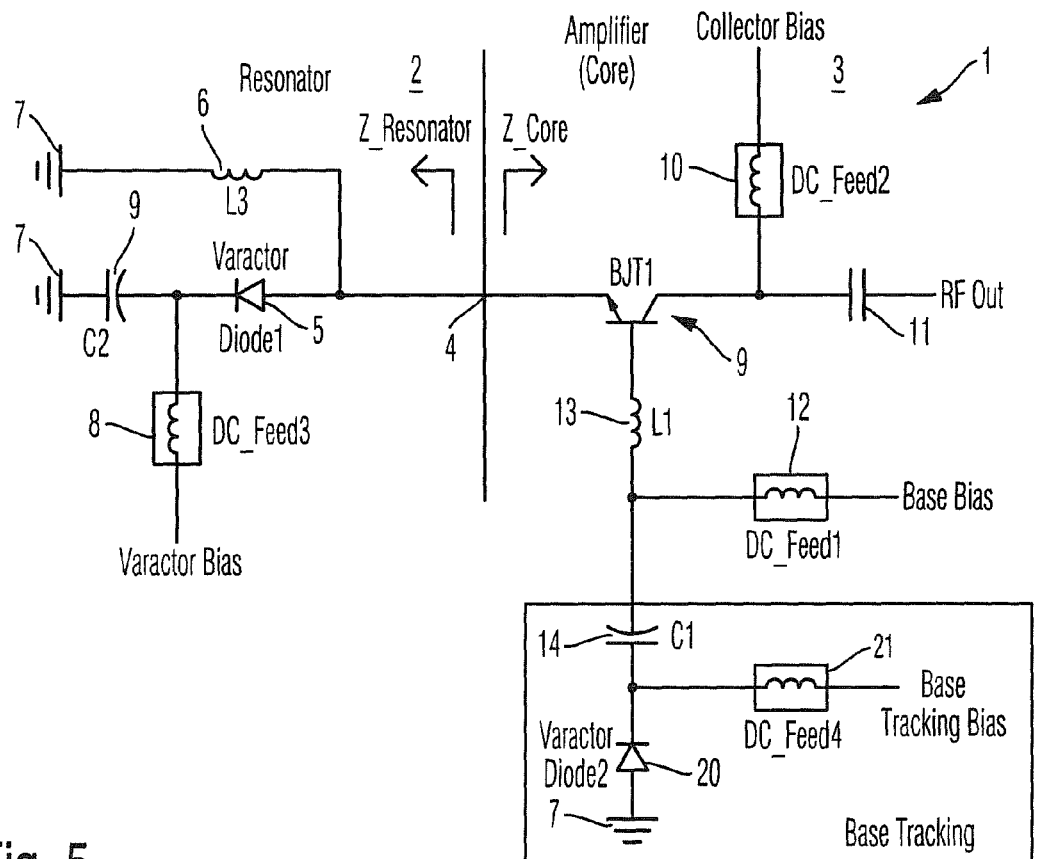
FIG. 5 shows a first exemplary embodiment of an oscillator according to the invention.

FIG. 5 shows a first exemplary embodiment of the oscillator 1 according to the invention. Elements already described with reference to FIG. 1 are indicated with the same reference numbers to avoid repetition of the description.

The peculiarity of the invention is that within the amplifier 3, a second tuneable element 20 is provided, by means of which the complex resistance Z_Core, which the amplifier provides at the coupling position 4, can be varied dependent upon frequency. In the illustrated exemplary embodiment, the second tuneable element 20 is also a varactor diode (variable-capacitance diode). In principle, however, other tuneable elements, for example, capacitors or inductances, which can be adjusted mechanically via an electrically-controllable actuator, may also be considered within the framework of the invention. The capacitance of the second varactor diode 20 is adjustable exactly as in the case of the first varactor diode 5 by varying the reverse voltage, referred to in FIG. 5 as the "Base Tracking Bias", which is supplied via the choke 21.

In the exemplary embodiment illustrated in FIG. 5, the cathode of the second varactor diode 20 is connected via the choke 21 to the positive pole of the voltage source, and the anode is connected to the circuit ground 7. The direct-current control path of the varactor diode 20 is separated from the base-current circuit of the transistor 9, thereby allowing a relatively simple structure. Furthermore, the tuning behavior of the core can be adjusted (slope conductance) with this capacitor. However, in principle, it is also possible to arrange the varactor diode 20 in another position, for example, between the inductance 13 and the capacitor 14 and, for example, to add a further separating capacitor between the varactor diode and the base-current circuit. The tuneable element can also be provided in the collector path or in the emitter path of the bipolar transistor 9.

Figure 6A:
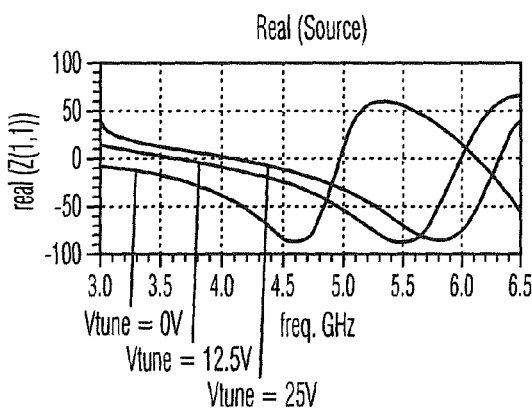
FIG. 6A shows the real part of the complex resistance of the amplifier according to FIG. 5 with different tuning voltages.
Figure 6B:
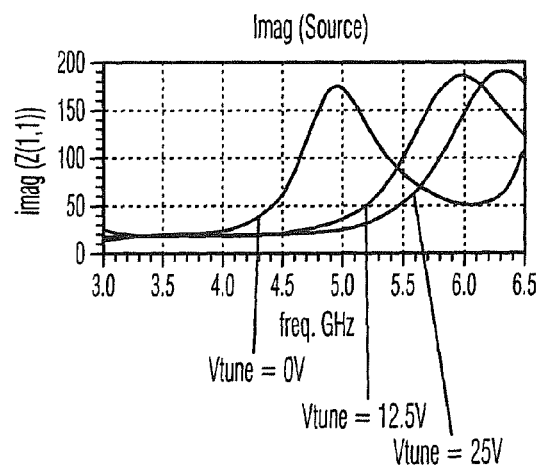
FIG. 6B shows the imaginary part of the complex resistance of the amplifier with different tuning voltages.

FIG. 6A shows the real part of the complex resistance Z_Core of the amplifier 3 as provided at the coupling position 4. FIG. 6B shows in a corresponding manner the imaginary part of the complex resistance Z_Core of the amplifier 3, as provided at the coupling position 4. A similar characteristic is obtained in FIGS. 3A and 3B, however, the position of the minima and maxima, especially the maximum of the imaginary part, can be varied dependent upon the voltage Vtune applied to the second varactor diode. As shown in FIG. 6B, the maximum of the imaginary part is disposed at approximately 4.9 GHz, if no voltage is applied to the second varactor diode 20 (Vtune=0 V). By contrast, when a reverse voltage of 12.5 V or respectively 25 V is applied, the maximum is 6 GHz and 6.3 GHz respectively.

Figure 7A:
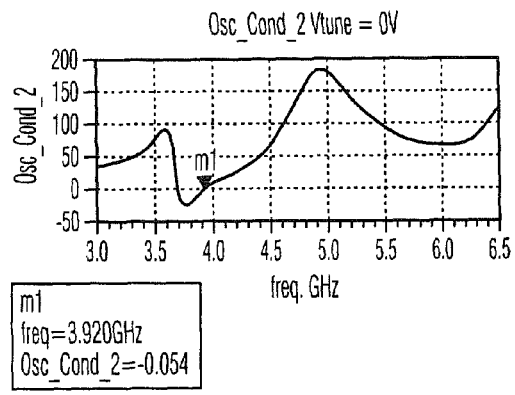
FIG. 7A shows the sum of the imaginary parts of the complex resistances of the resonator and of the amplifier with a tuning voltage of 0 V in the exemplary embodiment according to FIG. 5.
Figure 7B:
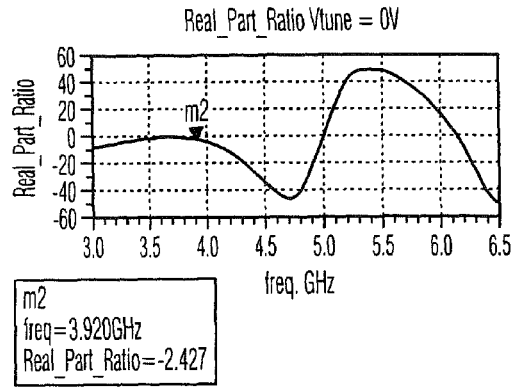
FIG. 7B shows the quotient of the real part of the complex resistance of the amplifier and of the real part of the complex resistance of the resonator with a tuning voltage of 0 V in the exemplary embodiment according to FIG. 5.
Figure 7C:
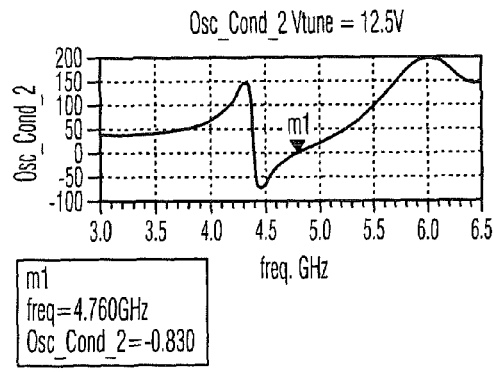
FIG. 7C shows the sum of the imaginary parts of the complex resistances of the resonator and of the amplifier with a tuning voltage of 12.5 V in the exemplary embodiment according to FIG. 5.
Figure 7D:
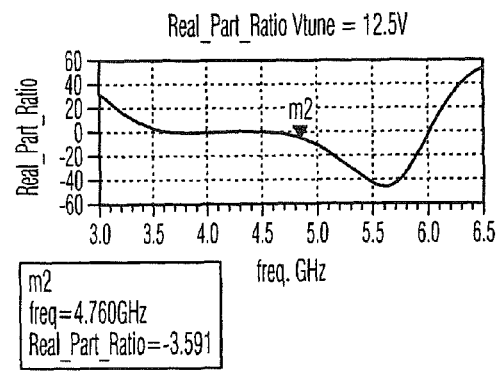
FIG. 7D shows the quotient of the real part of the complex resistance of the amplifier and of the real part of the complex resistance of the resonator with a tuning voltage of 12.5 V in the exemplary embodiment according to FIG. 5.
Figure 7E:
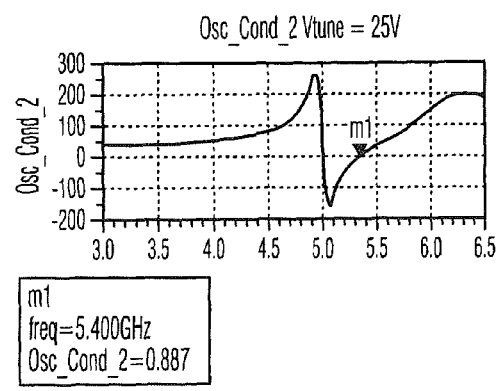
FIG. 7E shows the sum of the imaginary parts of the complex resistances of the resonator and of the amplifier with a tuning voltage of 25 V in the exemplary embodiment according to FIG. 5.
Figure 7F:
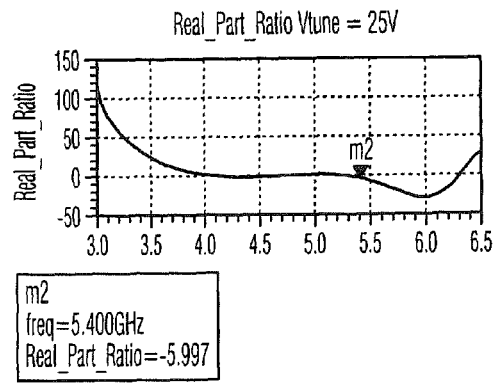
FIG. 7F shows the quotient of the real part of the complex resistance of the amplifier and of the real part of the complex resistance of the resonator with a tuning voltage of 25 V in the exemplary embodiment according to FIG. 5.

In FIGS. 7A, 7C and 7E, the imaginary part of the sum of the two complex resistances Z_Core and Z_Resonator is presented for different tuning voltages Vtune of 0 V, 12.5 V and 25 V, wherein this tuning voltage Vtune is applied in the same manner respectively to both varactor diodes 5 and 20. FIGS. 7B, 7D and 7F show the ratio of the real parts of the complex resistances Z_Core and Z_Resonator for the same tuning voltages Vtune 0 V, 12.5 V and 25 V. It is evident that the ratio of the real parts, and therefore the overall amplification of the system, is disposed between −2.427 in the case of Vtune=0 V, and −5.997 in the case of Vtune=25 V. An adequate start-up reserve is therefore provided over the entire bandwidth between 3.920 GHz and 5.400 GHz. The tuning range, in which the oscillator 1 can be operated, is therefore significantly greater than with the oscillator according to the prior art.

Besides the problem of reduced tuning bandwidth described above, the oscillator according to the prior art illustrated in FIG. 1 provides a relatively high phase noise at low tuning frequencies. With low tuning frequencies, that is to say, with large capacitances of the varactor diode 5, a relatively-small space-charge zone, and therefore a relatively large bulk resistance of the diodes, is provided. If the varactor diodes used are of low quality, these bulk resistances can lead to an unacceptably-high phase noise.

Figure 8:
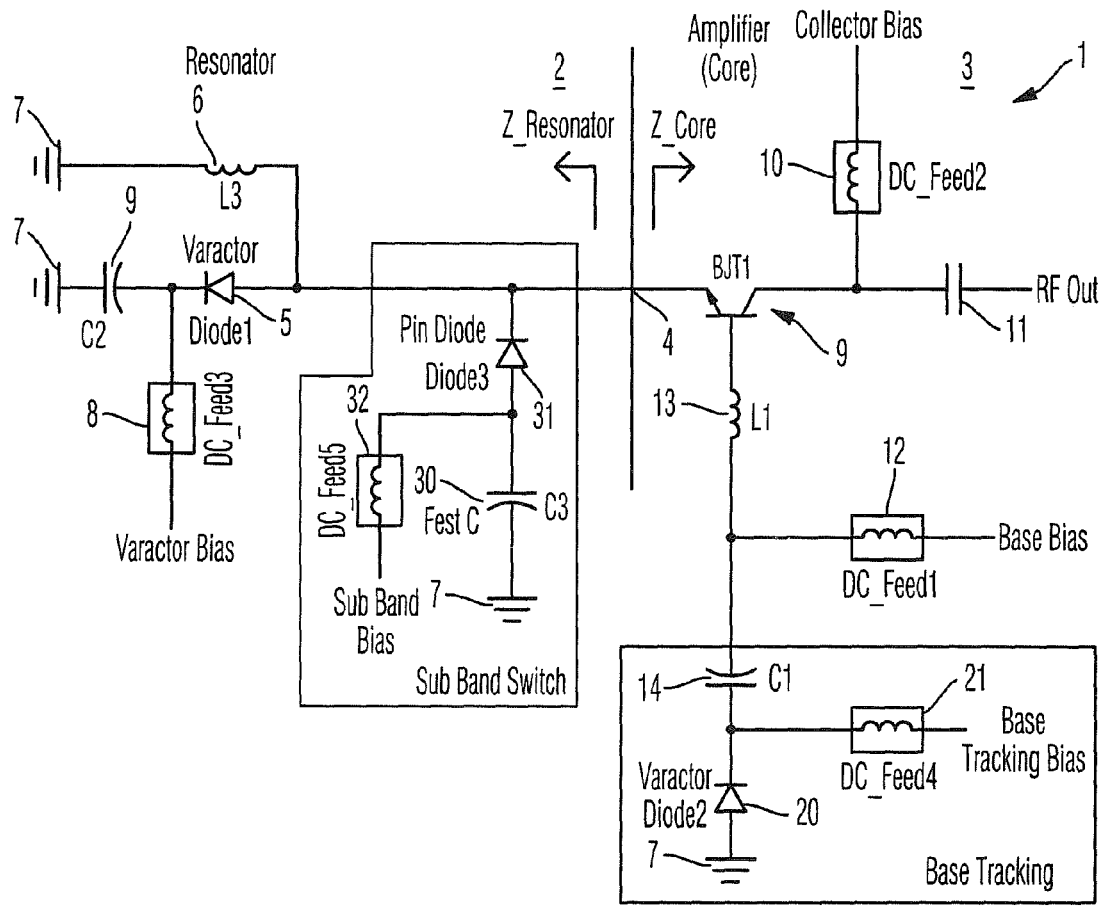
FIG. 8 shows a second exemplary embodiment of the oscillator according to the invention.

The exemplary embodiment presented in FIG. 8 is proposed in order to resolve this problem. Here also, elements already described with reference to FIG. 5 are indicated with corresponding reference numbers to avoid repetition of the description.

In the case of the exemplary embodiment illustrated in FIG. 8, at low frequencies, a capacitor 30 with fixed capacitance C3 is connected in parallel to the varactor diode 5 via a switching element 31. The switching element can be designed, for example, as a PIN-diode, of which the anode in the exemplary embodiment is connected via a choke 32 to the switching voltage "Sub Band Bias". In this context, the capacitor 30 is only connected in parallel to the varactor diode 5, when the PIN-diode 31 is connected by the application of the voltage "Sub Band Bias". As a result, the tuning range can be subdivided into two sub-bands. In an upper sub-band with relatively-high frequencies, the switching element 31 is not connected. In a lower sub-band with relatively low frequencies, the PIN-diode is connected, in order to connect the capacitor 30 in parallel to the varactor diode.

As a result of the fixed capacitance C3 connected in the lower sub-band, the resonant frequency is shifted to considerably-lower values. With the exemplary embodiment shown in FIG. 8, the required lower-frequency bandlimit of the oscillator 1 is therefore achieved with a tuning voltage of approximately 7.5 V instead of approximately 2 V in the case of the example shown in FIG. 1 or respectively the exemplary embodiment shown in FIG. 5. However, with a tuning voltage of 7.5 V, the varactor diode 5 provides a considerably-improved quality factor and a considerably-lower phase noise than with 2 V. The improvement in resonator quality factor and the reduction in the bandwidth of the lower sub-band therefore achieve an improvement in the phase noise in the critical, lower-frequency range. Realizing the switch-over by means of a PIN-diode incurs negligible additional costs.

Figure 9A:
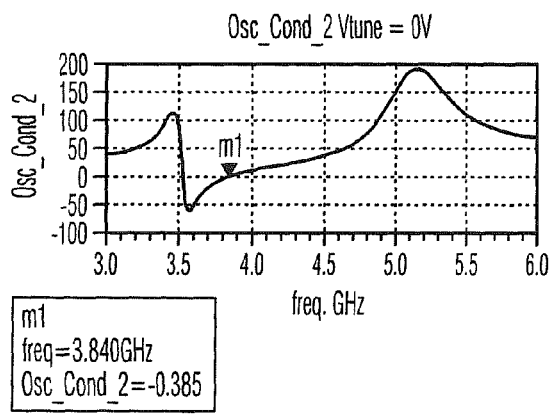
FIG. 9A shows the sum of the imaginary parts of the complex resistances of the resonator and of the amplifier with a tuning voltage of 0 V in the exemplary embodiment according to FIG. 8.
Figure 9B:
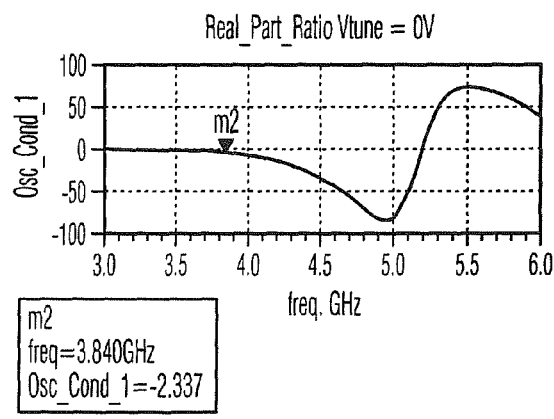
FIG. 9B shows the quotient of the real part of the complex resistance of the amplifier and of the real part of the complex resistance of the resonator with a tuning voltage of 0 V in the exemplary embodiment according to FIG. 8.
Figure 9C:
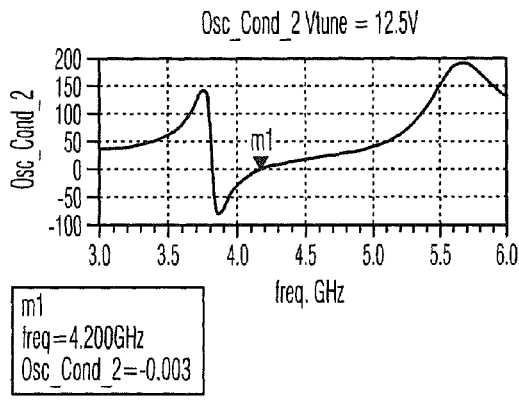
FIG. 9C shows the sum of the imaginary parts of the complex resistances of the resonator and of the amplifier with a tuning voltage of 12.5 V in the exemplary embodiment according to FIG. 8.
Figure 9D:
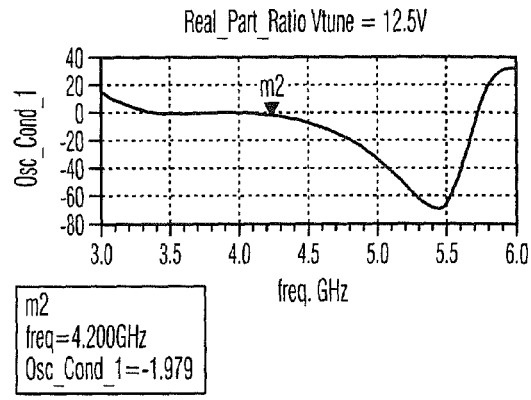
FIG. 9D shows the quotient of the real part of the complex resistance of the amplifier and the real part of the complex resistance of the resonator with a tuning voltage of 12.5 V in the exemplary embodiment according to FIG. 8.
Figure 9E:
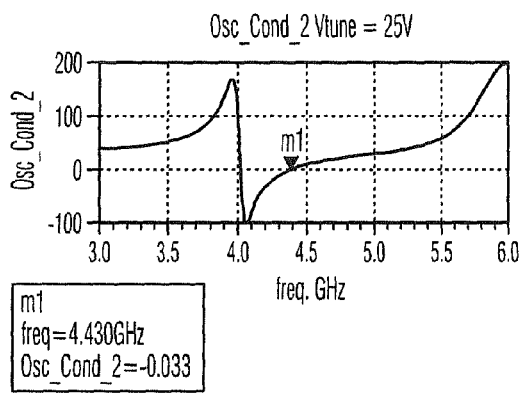
FIG. 9E shows the sum of the imaginary parts of the complex resistances of the resonator and of the amplifier with a tuning voltage of 25 V in the exemplary embodiment according to FIG. 8.
Figure 9F:
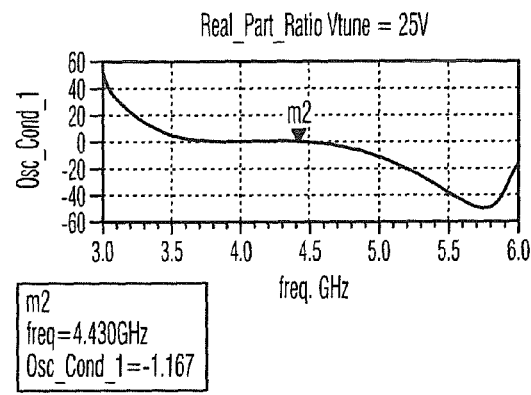
FIG. 9F shows the quotient of the real part of the complex resistance of the amplifier and of the real part of the complex resistance of the resonator with a tuning voltage of 25 V in the exemplary embodiment according to FIG. 8.

FIGS. 9A, 9C and 9E show respectively the imaginary part of Z_Core+Z_Resonator for the same tuning voltages Vtune of 0 V, 12.5 V and 25 V as FIGS. 7A, 7C and 7E. In a corresponding manner, FIGS. 9B, 9D and 9F show the ratio of the real parts of Z_Core to Z_Resonator for the same tuning voltages by analogy with FIGS. 7B, 7D and 7F. It is evident from a comparison of the presentation in FIG. 9 with the presentation in FIG. 7, that the imaginary parts and real parts of the resonator 2 and of the amplifier 3 are displaced relative to one another by switching over the resonator, so that the optimum start-up conditions are no longer fulfilled everywhere. With a high tuning voltage Vtune, only a minimum start-up reserve is available. This does not lead to an optimum phase noise, and, in extreme conditions, can even lead to a cutoff of the oscillation.

Figure 10:
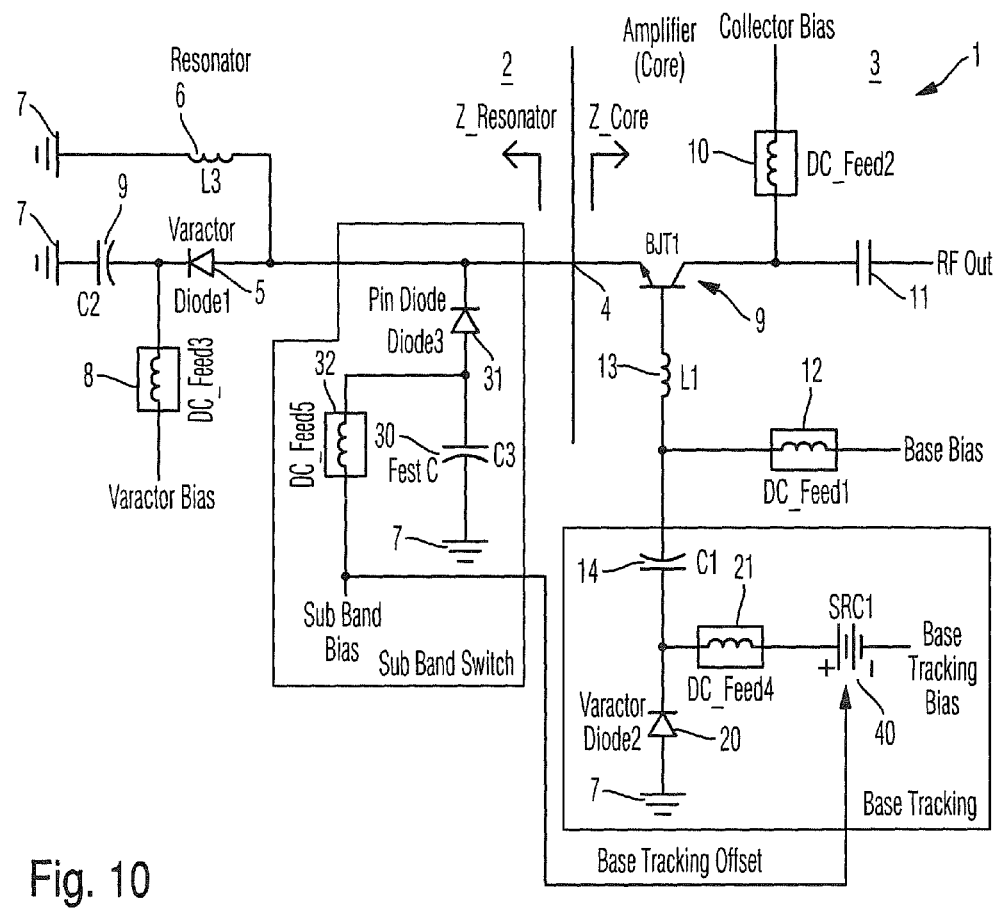
FIG. 10 shows a third exemplary embodiment of the invention.
Figure 11A:
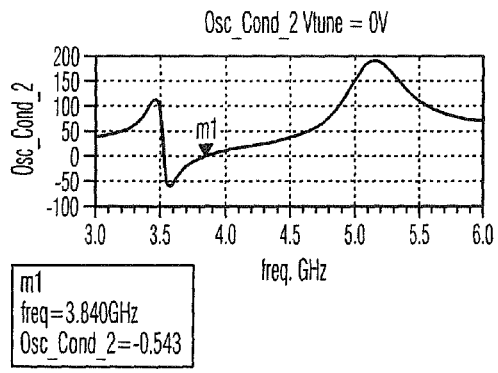
FIG. 11A shows the sum of the imaginary parts of the complex resistances of the resonator and of the amplifier with a tuning voltage of 0 V in the exemplary embodiment according to FIG. 10.
Figure 11B:
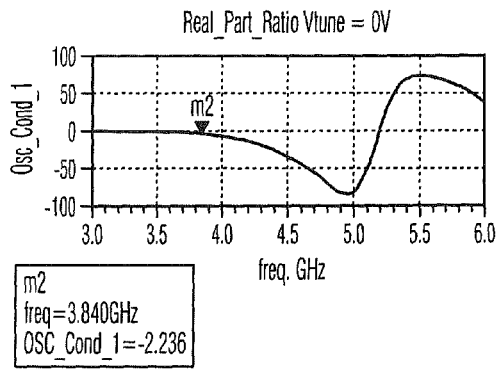
FIG. 11B shows the quotient of the real part of the complex resistance of the amplifier and of the real part of the complex resistance of the resonator with a tuning voltage of 0 V in the exemplary embodiment according to FIG. 10.
Figures 11C, 11D:
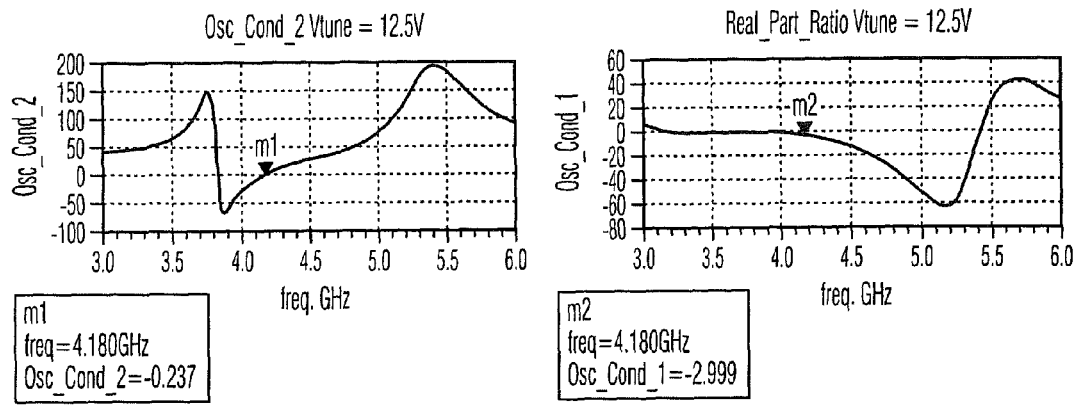
FIG. 11C shows the sum of the imaginary parts of the complex resistances of the resonator and of the amplifier with a tuning voltage of 12.5 V in the exemplary embodiment according to FIG. 10.
FIG. 11D shows the quotient of the real part of the complex resistance of the amplifier and the real part of the complex resistance of the resonator with a tuning voltage of 12.5 V in the exemplary embodiment according to FIG. 10.
Figures 11E, 11F:
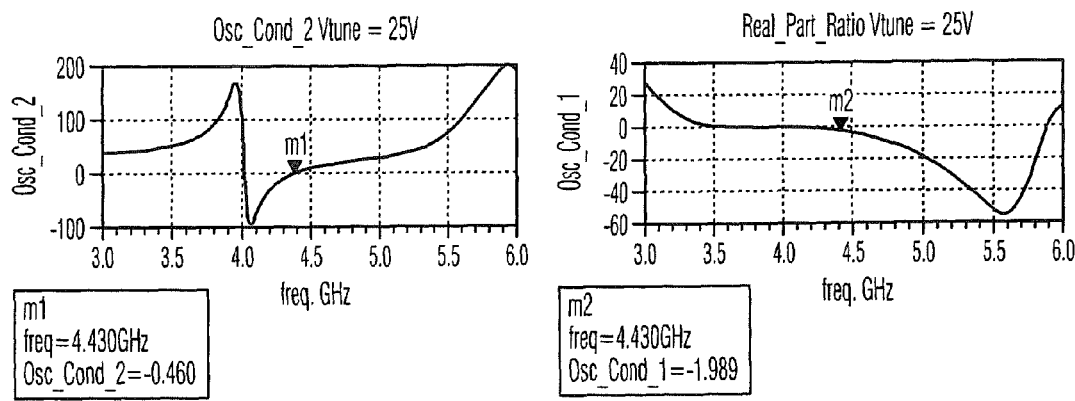
FIG. 11E shows the sum of the imaginary parts of the complex resistances of the resonator and of the amplifier with a tuning voltage of 25 V in the exemplary embodiment according to FIG. 10.
FIG. 11F shows the quotient of the real part of the complex resistance of the amplifier and of the real part of the complex resistance of the resonator with a tuning voltage of 25 V in the exemplary embodiment according to FIG. 10.

In order to avoid this, it is proposed, in the third exemplary embodiment presented in FIG. 10, not to apply the same tuning voltage to the tuning element 5 of the resonator 2 and to the tuning element 20 of the amplifier 3, but to introduce an offset voltage (voltage offset) between the two tuning voltages. However, the introduction of the offset voltage is implemented only in the lower sub-band with low frequencies.

With regard to the third exemplary embodiment presented in FIG. 10, elements already described with reference to FIG. 8 are indicated with corresponding reference numbers to avoid repetition of the description.

The exemplary embodiment presented in FIG. 10 provides a supplementary voltage source 40, which is connected in series with the tuning voltage "Base Tracking Bias" for the tuning of the second tuning element 20. The voltage source can be picked up at any position between the poles "+" and "−". This offset voltage "Base Tracking Offset" is additionally supplied to the tuning voltage "Base Tracking Bias". It is therefore added to the tuning voltage "Base Tracking Bias" of the second tuning element 20. The advantage of a simultaneous supply with the switching on of the switching element 31 is that the offset voltage is supplied to the second tuning element 20 only if the switching element 31 is switched into the lower sub-band, that is to say, only with low frequencies.

By analogy with FIGS. 9A, 9C and 9E, FIGS. 11A, 11C and 11E show the sum of the imaginary parts of the complex resistances Z_Core and Z_Resonator. By analogy with FIGS. 9B, 9D and 9F, FIGS. 11B, 11D and 11F show the ratio of the real parts of the complex resistances Z_Core and Z_Resonator. Comparison of FIGS. 11B, 11D and 11F with FIGS. 9B, 9D and 9F shows clearly that an adequate start-up reserve is achieved over the entire tuning range.

The invention is not restricted to the exemplary embodiments presented. Tuning elements other than varactor diodes, for example, mechanically-adjustable capacitors or inductances can be used. A field-effect transistor can also be used instead of a bipolar transistor. The offset voltage need not necessarily be generated by a separate voltage source. The voltages could also be derived from a common voltage source via a simple resistance-voltage divider.

The invention claimed is:

1. An oscillator comprising:
   a resonator with at least one first tuneable element, with which a resonant frequency of the resonator can be varied, and one supplementary capacitor selectively connectable in parallel, by a switching device, to the at least one first tuneable element; and
   an amplifier, which provides an amplification element, connected to the resonator at a coupling position,
   wherein the amplifier provides a second tuneable element, by which a complex resistance, which the amplifier provides at the coupling position, is variable in a frequency-dependent manner,
   wherein the first tuneable element is a varactor diode, and wherein, in the presence of low resonant frequencies of the resonator, the supplementary capacitor is connected in parallel to the varactor diode of the first tuneable element by the switching device, the first and second tuneable elements providing for a tuning range subdivided into two sub-bands.

2. The oscillator according to claim 1, wherein the variation of the complex resistance, which the amplifier provides at the coupling position, is implemented by the second tuneable element in such a manner that a quotient of a real part of the complex resistance, which the amplifier provides at the coupling position, with respect to a real part of a complex resistance, which the resonator provides at the coupling position, is always less than −1.

3. The oscillator according to claim 2, wherein the quotient is less than or equal to −3, in order to secure a start-up reserve.

4. The oscillator according to claim 3, wherein the amplification element is a bipolar transistor.

5. The oscillator according to claim 3, wherein the amplification element is a field-effect transistor.

6. The oscillator according to claim 2, wherein the amplification element is a bipolar transistor.

7. The oscillator according to claim 2, wherein the amplification element is a field-effect transistor.

8. The oscillator according to claim 1, wherein the amplification element is a bipolar transistor.

9. The oscillator according to claim 8, wherein:
the bipolar transistor is connected in common-base configuration;
the second tuneable element is a varactor diode; and
the varactor diode of the second tuneable element is disposed between the base of the bipolar transistor and a circuit ground.

10. The oscillator according to claim 1, wherein the amplification element is a field-effect transistor.

11. The oscillator according to claim 10, wherein:
the field-effect transistor is connected in common-gate configuration;
the second tuneable element is a varactor diode; and
the varactor diode of the second tuneable element is disposed between the gate of the field-effect transistor and a circuit ground.

12. The oscillator according to claim 1, wherein the first tuneable element of the resonator and the second tuneable element of the amplifier are tuned with a mutual offset.

13. The oscillator according to claim 12, wherein a voltage source generates an offset voltage, which can be additionally supplied to the second tuneable element dependent upon the switching position of the switching device.

* * * * *